(12) United States Patent
Sim et al.

(10) Patent No.: US 11,958,206 B2
(45) Date of Patent: Apr. 16, 2024

(54) CUTTING APPARATUS AND METHOD OF MANUFACTURING DISPLAY DEVICE BY USING SAME

(71) Applicant: Samsung Display Co., Ltd., Yongin-si (KR)

(72) Inventors: Junho Sim, Yongin-si (KR); Byunghoon Kang, Yongin-si (KR); Seungjun Moon, Yongin-si (KR); Dongkyun Seo, Yongin-si (KR); Heekyun Shin, Yongin-si (KR); Woojin Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 542 days.

(21) Appl. No.: 16/427,498

(22) Filed: May 31, 2019

(65) Prior Publication Data

US 2020/0047369 A1 Feb. 13, 2020

(30) Foreign Application Priority Data

Aug. 7, 2018 (KR) .......................... 10-2018-0092056

(51) Int. Cl.
*B26F 3/00* (2006.01)
*B26D 7/18* (2006.01)
(Continued)

(52) U.S. Cl.
CPC ............. *B26F 3/002* (2013.01); *B26D 7/1863* (2013.01); *B32B 38/10* (2013.01); *H01L 21/683* (2013.01)

(58) Field of Classification Search
CPC ......... Y10T 156/1174; Y10T 156/1168; Y10T 156/1179; B32B 38/10; B32B 38/105;
(Continued)

(56) References Cited

U.S. PATENT DOCUMENTS 7,713,368 B2 * 5/2010 Yoshioka .......... H01L 21/67132
156/247
8,409,973 B2 * 4/2013 Chida ............... H01L 21/68735
438/478
(Continued)

FOREIGN PATENT DOCUMENTS

CN 1856392 A 11/2006
CN 101110353 A 1/2008
(Continued)

OTHER PUBLICATIONS

Chinese Office Action for Chinese Patent Application No. 201910720991.3 dated Apr. 24, 2022.

*Primary Examiner* — Evan H MacFarlane
(74) *Attorney, Agent, or Firm* — CANTOR COLBURN LLP

(57) ABSTRACT

A cutting apparatus includes: a stage on which is disposed a preliminary stacked body from which a cut stacked body having an edge is formed; a cutting unit movable along a first direction corresponding to an extension direction of the edge of the cut stacked body and with which the preliminary stacked body is cut to form the cut stacked body; a first detaching unit movable in a direction forming an acute angle with the first direction and including a first detaching tool which contacts the cut stacked body in detaching of the cut stacked body from the carrier substrate; and a second detaching unit movable in a direction parallel to the first direction and including a second detaching tool which is inserted between the cut stacked body and the carrier substrate in the detaching of the cut stacked body from the carrier substrate.

9 Claims, 6 Drawing Sheets

(51) Int. Cl.
   *B32B 38/10* (2006.01)
   *H01L 21/683* (2006.01)

(58) Field of Classification Search
   CPC ... B32B 38/0004; B32B 43/00; B32B 43/003; B32B 43/006; B26F 3/002; H01L 21/683; H01L 21/6838; H01L 51/5253; H01L 51/56; H01L 51/003; D26D 7/18; D26D 7/1818; D26D 7/1836; B25B 11/005
   See application file for complete search history.

(56) References Cited

U.S. PATENT DOCUMENTS

| | | | |
|---|---|---|---|
| 8,951,084 B2 | 2/2015 | Kwon et al. | |
| 9,388,278 B2 | 7/2016 | Lin et al. | |
| 9,393,769 B2 | 7/2016 | Koo et al. | |
| 9,914,290 B2* | 3/2018 | Park | B65H 29/54 |
| 2007/0214925 A1 | 9/2007 | Nishio et al. | |
| 2011/0318906 A1 | 12/2011 | Chida et al. | |
| 2015/0059986 A1* | 3/2015 | Komatsu | C03B 33/027 |
| | | | 83/872 |
| 2015/0072454 A1 | 3/2015 | Kim et al. | |
| 2015/0122427 A1* | 5/2015 | Koo | B32B 43/006 |
| | | | 156/707 |
| 2015/0140705 A1 | 5/2015 | Lee et al. | |
| 2016/0016397 A1* | 1/2016 | Xie | H01L 21/67132 |
| | | | 156/759 |
| 2016/0018682 A1 | 1/2016 | Kim et al. | |
| 2017/0348961 A1 | 12/2017 | Choi et al. | |

FOREIGN PATENT DOCUMENTS

| | | | | |
|---|---|---|---|---|
| CN | 108218212 A | | 6/2018 | |
| EP | 3120971 A1 | | 1/2017 | |
| EP | 3120971 A1 | * | 1/2017 | ............... B24B 9/10 |
| JP | 2001328039 A | | 11/2001 | |
| KR | 20000038517 A | | 7/2000 | |
| KR | 20030054720 A | | 7/2003 | |
| KR | 10-2009-0007070 | * | 1/2009 | ............. B29C 55/18 |
| KR | 20090007070 A | | 1/2009 | |
| KR | 1020130091849 A | | 8/2013 | |
| KR | 1020130099777 A | | 9/2013 | |
| KR | 1020140033863 A | | 3/2014 | |
| KR | 1020150029429 A | | 3/2015 | |
| KR | 1020150040200 A | | 4/2015 | |
| KR | 1020150051280 A | | 5/2015 | |
| KR | 1020150057806 A | | 5/2015 | |
| KR | 20160011298 A | | 2/2016 | |
| KR | 10-1612076 | * | 4/2016 | ............. B65H 41/00 |
| KR | 1020170137268 A | | 12/2017 | |

* cited by examiner

CUTTING APPARATUS AND METHOD OF MANUFACTURING DISPLAY DEVICE BY USING SAME

This application claims priority to Korean Patent Application No. 10-2018-0092056, filed on Aug. 7, 2018, and all the benefits accruing therefrom under 35 U.S.C. § 119, the disclosure of which is incorporated herein in its entirety by reference.

BACKGROUND

1. Field

One or more embodiments relate to a cutting apparatus, and a method of manufacturing a display device by using the cutting apparatus.

2. Description of the Related Art

As the field of display technology visually expressing various electrical signal information has rapidly developed, various flat panel display devices having excellent characteristics such as a relatively thin thickness, light weight and low power consumption, have been researched and developed. In particular, a flexible display device in which a display unit is disposed on a flexible substrate having a relatively small thickness has gained attention.

However, when a thickness of a substrate of a display device is relatively small, support for elements formed thereon may be difficult during a manufacturing process of the display device.

SUMMARY

One or more embodiments include a cutting apparatus capable of easily separating a carrier substrate from a base substrate, and a method of manufacturing a display device by using the cutting apparatus.

Additional features will be set forth in part in the description which follows and, in part, will be apparent from the description, or may be learned by practice of the presented embodiments.

According to one or more embodiments, a cutting apparatus includes a stage on which are disposed a carrier substrate and a preliminary stacked body which is on the carrier substrate and from which a cut stacked body having an edge is formed on the stage; a cutting unit disposed adjacent to the stage, movable along a first direction corresponding to an extension direction of the edge of the cut stacked body and with which the preliminary stacked body is cut to form the cut stacked body; a first detaching unit disposed adjacent to the stage and movable in a direction forming an acute angle with the first direction, the first detaching unit including a first detaching tool which contacts the cut stacked body in detaching of the cut stacked body from the carrier substrate; and a second detaching unit disposed adjacent to the stage and movable in a direction parallel to the first direction, the second detaching unit including a second detaching tool which protrudes in a second direction intersecting to the first direction and is inserted between the cut stacked body and the carrier substrate in the detaching of the cut stacked body from the carrier substrate.

In an embodiment, the stage may have a planar shape and may be rotatable with respect to a center of the planar shape.

In an embodiment, the first detaching unit may be arranged adjacent to a corner of the cut stacked body.

In an embodiment, the first detaching tool may be movable from the corner of the cut stacked body and along a line inclined with respect to both the first and second directions, and the first detaching tool in contact with the cut stacked body may be moved along the line inclined with respect to both the first and second directions, in the detaching of the cut stacked body from the carrier substrate.

In an embodiment, by movement of the second detaching unit, the second detaching tool may be movable from the corner of the cut stacked body and in the first direction along the edge of the cut stacked body, and the second detaching tool inserted between the cut stacked body and the carrier substrate may be moved along the edge of the cut stacked body, in the detaching of the cut stacked body from the carrier substrate.

In an embodiment, the cutting unit may include a scribing wheel.

In an embodiment, the scribing wheel may be movable in a moving direction of the cutting unit, and the cutting unit may further include a suction unit which follows the scribing wheel along the moving direction of the cutting unit.

In an embodiment, the cutting apparatus may further include a first guide rail positioned adjacent to the stage and lengthwise extending in the direction parallel to the first direction, and a first horizontal moving unit connected to the first guide rail to be movable along the first guide rail in the direction parallel to the first direction. The cutting unit may be connected to the first horizontal moving unit to be movable along the first horizontal moving unit in the second direction.

In an embodiment, the cutting apparatus may further include a first connecting unit connecting the first horizontal moving unit and the cutting unit to each other. The first connecting unit may adjust a height of the cutting unit.

In an embodiment, the cutting apparatus may further include a second horizontal moving unit connected to the first guide rail, and the second detaching unit may be connected to the second horizontal moving unit to be movable along the second horizontal moving unit in the second direction.

In an embodiment, the cutting apparatus may further include a second guide rail positioned adjacent to the stage, the first detaching unit being connected to the second guide rail. An extending direction of the first guide rail and an extending direction of the second guide rail may form an acute angle with each other.

In an embodiment, the stage may include a plurality of vacuum holes.

In an embodiment, the stage may include a central portion having a flat surface, and an inclined portion having an inclined surface disposed outside the central portion.

In an embodiment, a suction force generated by the vacuum holes at the inclined portion is greater than a suction force generated by the vacuum holes at the central portion.

According to one or more embodiments, a method of manufacturing a display device includes providing a release layer on a carrier substrate; providing a preliminary base substrate from which a base substrate of the display device is formed, on the release layer and the carrier substrate; providing a display unit of the display device on a portion of the preliminary base substrate which corresponds to the release layer; cutting the preliminary base substrate at a location of the release layer which is disposed outside of the display unit, to form the base substrate including the display unit thereon, the location of the release layer corresponding to an edge of the base substrate; initially detaching an edge region of the base substrate which inwardly extends from the edge thereof, from the carrier substrate; and separating a remaining region of the base substrate which inwardly extends from the edge region thereof, from the carrier substrate.

In an embodiment, the base substrate may include two edges and a corner at which the two edges meet, from each of the two edges, the edge region of the base substrate inwardly extends along lengths of the two edges and inwardly extends at the corner of the base substrate, and the initially detaching the base substrate may include a first initial detaching which detaches the edge region of the base substrate at the corner thereof, from the carrier substrate, and a second initial detaching which detaches the edge region of the base substrate along a length of one edge among the two edges which extends from the corner, from the carrier substrate.

In an embodiment, the method of manufacturing a display device may further include providing a preliminary protection film on the preliminary base substrate to dispose the display unit between the preliminary base substrate and the preliminary protection film. The cutting of the preliminary base substrate includes cutting the preliminary protection film together with the preliminary base substrate at the location of the release layer, to form the base substrate further including a cut protection film on the display unit.

In an embodiment, the preliminary base substrate may be cut by a scribing wheel.

In an embodiment, the cutting of the preliminary base substrate may include a first cutting of the preliminary base substrate at a first scribing line corresponding to the edge of the base substrate, and a second cutting of the preliminary base substrate at a second scribing line which is spaced apart from the first scribing line to be disposed further from the display unit than the first scribing line. The method may further include before the initially detaching the edge region of the base substrate, removing a portion of the preliminary base substrate positioned between the first scribing line and the second scribing line from the carrier substrate.

In an embodiment, the disposing the preliminary base substrate on the release layer and the carrier substrate may include disposing an edge portion of the preliminary base substrate inclined with respect to a remaining portion of the preliminary base substrate, the remaining portion corresponding to the display unit and the cutting of the preliminary base substrate is performed at a boundary between the inclined edge portion and the remaining portion of the preliminary base substrate.

Other features, and advantages will become apparent from the following drawings, claims, and detailed description.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
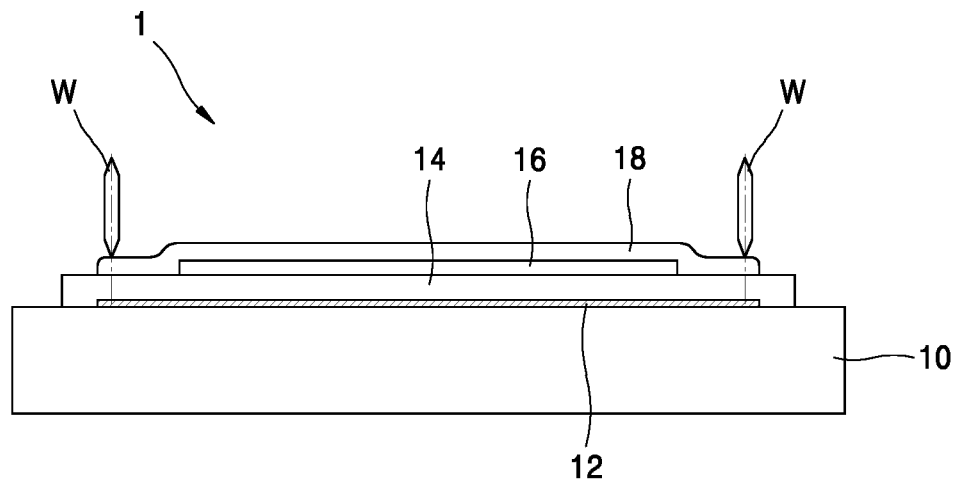
FIGS. 1 through 4 are various cross-sectional and top plan views illustrating embodiments of processes in a method of manufacturing a display device, according to the invention.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the invention.

It will be understood that although the terms "first," "second," etc. may be used herein to describe various components, these components should not be limited by these terms.

As used herein, the singular forms "a," "an" and "the" are intended to include the plural forms as well, unless the context clearly indicates otherwise.

It will be further understood that "at least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or component is referred to as being related to another element such as being "on" another layer, region, or component, it can be directly or indirectly formed on the other layer, region, or component. That is, for example, intervening layers, regions, or components may be present. In contrast, when a layer, region, or component is referred to as being related to another element such as being "directly on" another layer, region, or component, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Hereinafter, embodiments of the present disclosure will be described in detail with reference to the accompanying drawings, where like reference numerals refer to a same or a corresponding component throughout the drawings.

To provide support for elements formed on a relatively thin substrate of a display device during a manufacturing process of the display device, a carrier substrate separate from the substrate is prepared. The substrate having a relatively small thickness is attached onto the carrier substrate, and then a display unit of the display device is formed on the substrate while being supported by the carrier substrate. The display device is further manufactured through a process of separating the substrate from the carrier substrate. Therefore, the production efficiency of the display device may be determined depending on how smoothly the carrier substrate may be bonded to and separated from the substrate of the display device.

As a method of separating the substrate of the display device from the carrier substrate, irradiating a laser beam to a boundary or interface between the carrier substrate and the substrate is widely used. However, this process utilizes relatively expensive equipment and the substrate and/or the display unit may possibly be damaged by the laser irradiation.

FIGS. 1 through 4 are various cross-sectional and top plan views illustrating embodiments of processes in a method of manufacturing a display device 1, according to the invention.

Referring to FIGS. 1 through 4, a method of manufacturing the display device 1 includes forming a release layer 12 on a carrier substrate 10, attaching a preliminary base substrate 14 to the carrier substrate 10 to cover the release layer 12, forming a display unit 16 over the preliminary base substrate 14, cutting the preliminary base substrate 14 to divide a portion thereof to include the display unit 16 inside a region of the release layer 12, and separating the portion of the cut preliminary base substrate 14 from the carrier substrate 10. In addition, a preliminary first protective film 18 may be laminated above the preliminary base substrate 14 so as to cover the display unit 16. An end of the preliminary base substrate 14 and/or the preliminary first protective film 18 may extend further than a location corresponding to an end or edge of the display device 1 to be formed from the preliminary base substrate 14 and/or the preliminary first protective film 18. In this case, the preliminary first protection film 18 and the preliminary base substrate 14 may be cut together to include the display unit 16 inside a region of the release layer 12. The display device 1 may include the portion of the cut preliminary base substrate 14 and the display unit 16 thereon. The display device 1 may additionally include one or more of the portion of the cut preliminary first protective film 18 and a portion of the release layer 12.

Figure 2:
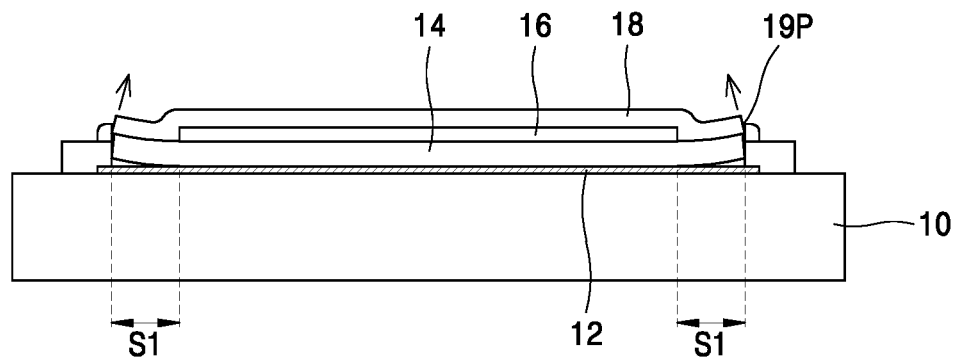
Figure 3:
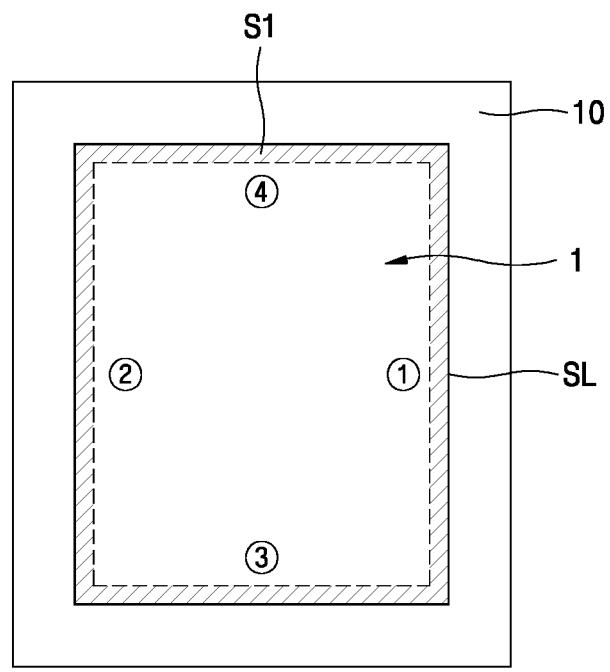
Figure 4:
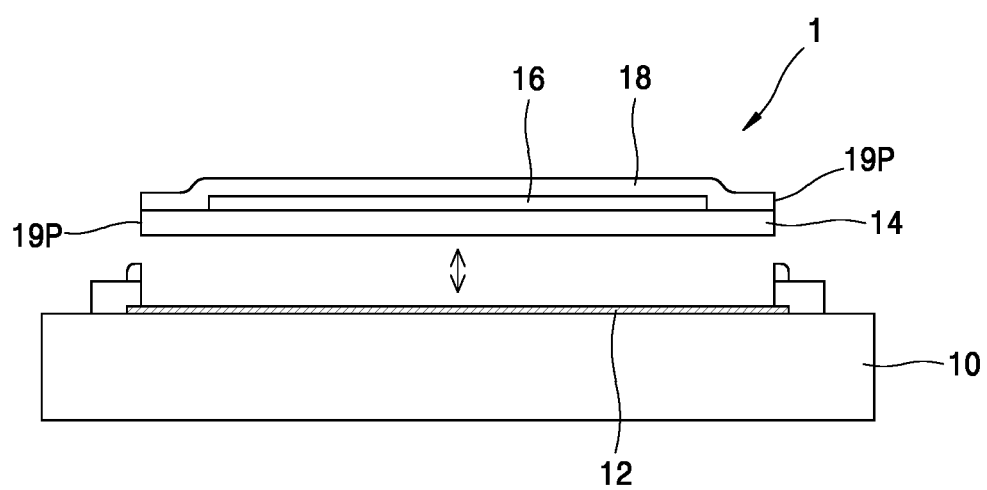

The preliminary base substrate 14 and the cut portion thereof may each have a relatively small thickness along a thickness direction of the display device 1 (e.g., along a vertical direction in FIGS. 1, 2 and 4 and into the view of FIG. 3). For purposes of description, the preliminary base substrate 14 and the cut portion thereof which is used in the finally manufactured display device 1 may hereinafter be simply referred to as "base substrate 14."

The carrier substrate 10 may include or be formed as a glass material. The carrier substrate 10 may maintain the preliminary base substrate 14 in a relatively flat state when the display unit 16 is formed on the preliminary base substrate 14 having the relatively small thickness.

The release layer 12 is formed on a portion of an upper surface of the carrier substrate 10. An end of the release layer 12 may extend further than a location corresponding to an end or edge of the display device 1 formed from layers further disposed on the carrier substrate 10 and/or the release layer 12. A portion of the upper surface of the carrier substrate 10 is exposed from the release layer 12. The release layer 12 may reduce or effectively prevent the carrier substrate 10 from directly contacting the portion of the cut preliminary base substrate 14 for easier separation of the carrier substrate 10 from such portion of the cut preliminary base substrate 14. The release layer 12 may include graphene oxide. In an embodiment, for example, the release layer 12 may be formed by spin-coating a dispersion of the graphene oxide on the carrier substrate 10.

The preliminary base substrate 14 and the cut portion thereof may include a polymer resin such as polyethersulphone ("PES"), polyacrylate ("PA"), polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), or cellulose acetate propionate ("CAP"). The base substrate 14 may have flexibility. In addition, the base substrate 14 may be an ultra-thin glass substrate having a cross-sectional thickness of about 50 micrometers (µm) to about 100 µm.

In a top plan view, the base substrate 14 has a greater planar area than the release layer 12. Thus, an edge or end portion of the base substrate 14 may be in direct contact with the upper surface of the carrier substrate 10 which is disposed outside of an end of the release layer 12. A bonding force of a region where the base substrate 14 and the carrier substrate 10 are in direct contact with each other is greater than a bonding force of a region where the release layer 12 and the base substrate 14 are in contact with each other. Accordingly, even when the release layer 12 is formed, a position of the base substrate 14 may be firmly maintained during a process of forming the display unit 16 or the like. In an embodiment, the bonding force between the base substrate 14 and the carrier substrate 10 which are in direct contact with each other may be about 5 gram force per inch (gf/inch), and the bonding force between the release layer 12 and the base substrate 14 which are in contact with each other may be between about 1 gf/inch and about 2 gf/inch.

Within the display device 1, the display unit 16 may include a light emitting element, a thin film transistor which is electrically connected to the light emitting element, or the like, which are controlled or driven to generate and/or display an image. In addition, the display unit 16 may include a sealing member for sealing the light emitting element from an external environment. The sealing member may have a laminated structure in which an inorganic film and an organic film are alternately laminated. In an embodiment, for example, the sealing member may have a structure in which an organic film is arranged between two inorganic films. The two inorganic films may be respectively arranged on the upper surface and the lower surface of the organic film. In addition, the display unit 16 may further include a touch unit, a polarizing member, or the like.

Referring to FIGS. 2 and 4, for example, after the display unit 16 is formed, the base substrate 14 including the display unit 16 thereon, is separated from the carrier substrate 10. As described above, since the region where the base substrate 14 and the carrier substrate 10 are in direct contact with each other has a relatively high bonding force, the base substrate 14 may be difficult to be separated from the carrier substrate 10 at the region. Therefore, for easier separation of the base substrate 14 from the carrier substrate 10, the base substrate 14 is cut at a region in which the base substrate 14 and the carrier substrate 10 are not included. That is, the base substrate 14 is cut inside the region of the release layer 12 so as to include the display unit 16 inside the region of the release layer 12.

The base substrate 14 may be cut by a scribing wheel W. The scribing wheel W may be applied along a scribing line to be described later.

In an embodiment, when the display device 1 has an overall rectangular shape in the top plan view, the base substrate 14 is cut along one or more of the edges which define the rectangular shape. As shown in FIG. 3, a cutting order of the edges may not be continuous in a clockwise or counterclockwise direction. The base substrate 14 including the display unit 16 thereon may be firstly cut along a pair of relatively long sides (① and ②), and then secondly cut along a pair of relatively short sides (③ and ④). As a result, distortion and twist of the base substrate 14 may be minimized during the cutting process.

Referring again to FIG. 2, an edge region S1 of the cut portion of the preliminary base substrate 14 which is divided from a remainder of the preliminary base substrate 14 at a scribing line SL (refer to FIG. 3, for example), is first detached from the carrier substrate 10, after the preliminary base substrate 14 is cut. The separation of the cut portion of the preliminary base substrate 14 from the carrier substrate 10 starts from one edge of the preliminary base substrate 14 which is cut (e.g., a preliminary edge 19P). At this time, a force which starts detachment of the cut portion of the preliminary base substrate 14 from the carrier substrate 10 is greater than a force to maintain or continue the detachment. Therefore, when the edge region S1 of the cut portion of the preliminary base substrate 14 is initially detached from the carrier substrate 10 before a remainder of the cut portion of the preliminary base substrate 14 and the carrier substrate 10 are completely separated from each other, the cut portion of the preliminary base substrate 14 and the carrier substrate 10 may be more easily separated from each other and damage to the display device 1 during the detaching process may be reduced or effectively prevented.

More particularly, in the top plan view, the cut portion of the preliminary base substrate 14 may include at least two sides or edges, and a corner which is formed by the intersection of the at least two sides or edges. A collective initial detaching of the cut portion of the preliminary base substrate 14 may include a first initial detaching operation of detaching the cut portion of the preliminary base substrate 14 from the carrier substrate 10 at the corner of the cut portion of the preliminary base substrate 14, and a second initial detaching operation of detaching the edge region of the base substrate 14 from the carrier substrate 10 along the sides or edges of the cut portion of the preliminary base substrate 14 which each extend from the corner. Such an initial detaching may be performed continuously with a cutting process, when the preliminary base substrate 14 is cut by using a cutting apparatus 100 in FIG. 5 described later.

The preliminary first protective film 18 may be further formed on the display unit 16 before the preliminary base substrate 14 is cut. The preliminary first protective film 18, of which a portion thereof serves as a layer for protecting the display device 1, may include a polypropylene film, a polyethylene terephthalate film, or the like. The preliminary first protective film 18 may be formed to have a greater planar area than the release layer 12 in the top plan view. Therefore, an end of the preliminary first protective film 18 may directly contact the preliminary base substrate 14 and may be cut together with the preliminary base substrate 14 when the preliminary base substrate 14 is cut. In an embodiment, where the cut portion of the preliminary first protective film 18 is disposed on an upper surface of the cut portion of the preliminary base substrate 14 which has been separated from the carrier substrate 10, a second protective film (not shown) may be disposed or formed on a lower surface of the cut portion of the preliminary base substrate 14 which has been separated from the carrier substrate 10.

Referring to FIG. 4, the cut portion of the preliminary base substrate 14 which is divided from a remainder of the preliminary base substrate 14, along with the display unit 16, is separated from the remaining portion of the preliminary base substrate 14 and the release layer 12. Here, a lower surface of the cut portion of the preliminary base substrate 14 which has been separated from the carrier substrate 10 is exposed to outside the display device 1. Where the preliminary first protective film 18 is cut together with the preliminary base substrate 14, cut portions of the preliminary base substrate 14 and preliminary first protective film 18, along with the display unit 16, are separated from the remaining portion of the preliminary first protective film 18, the remaining portion of the preliminary base substrate 14 and the release layer 12. The scribing line SL corresponds to one or more of an end or edge of the cut portion of the preliminary base substrate 14 (e.g., a preliminary edge 19P), an end or edge of the cut portion of the preliminary first protective film 18 (e.g., a preliminary edge 19P), etc. which forms the display device 1.

Figure 5:
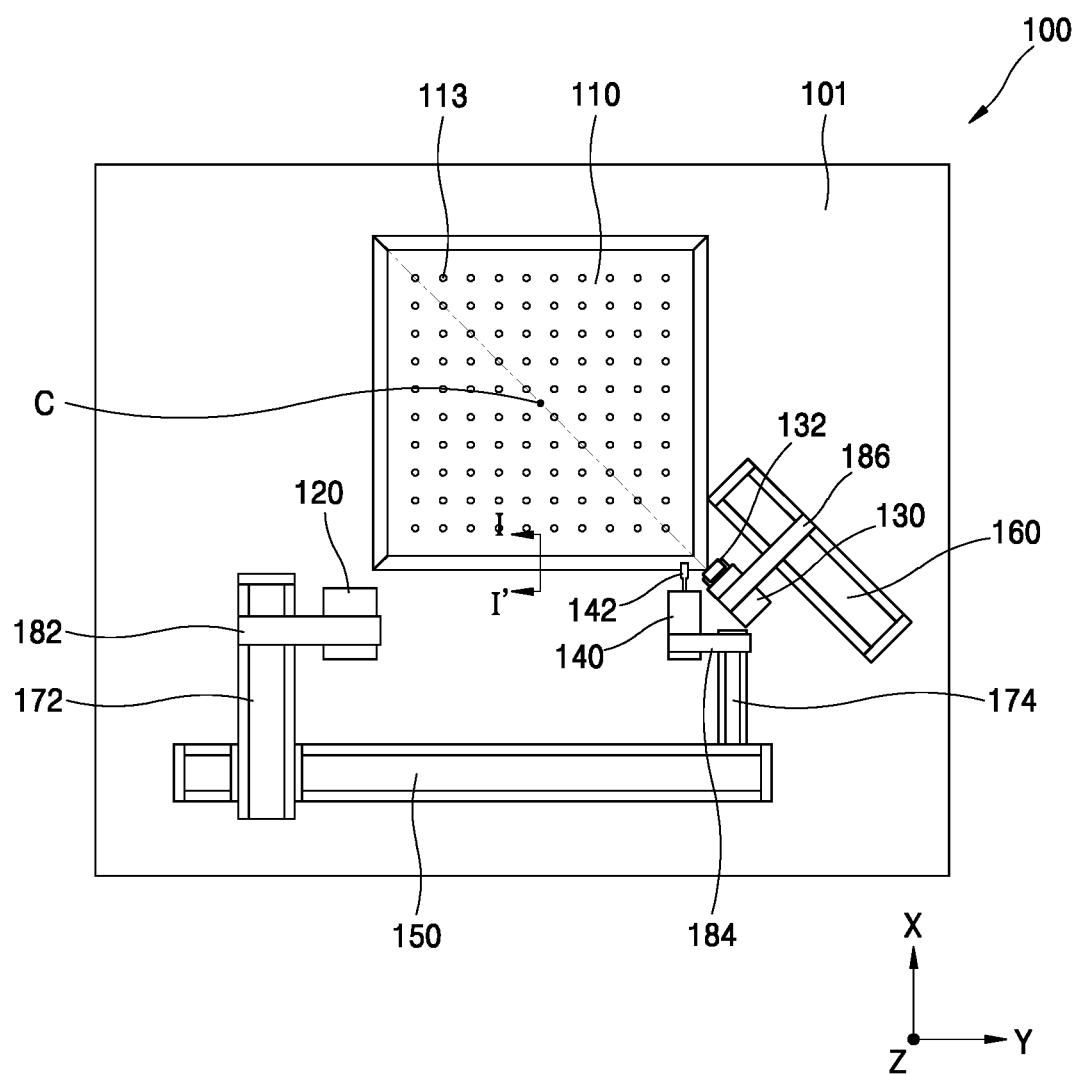
FIG. 5 is a schematic top plan view of an embodiment of a cutting apparatus used in manufacturing a display device, according to the invention.
Figure 6:
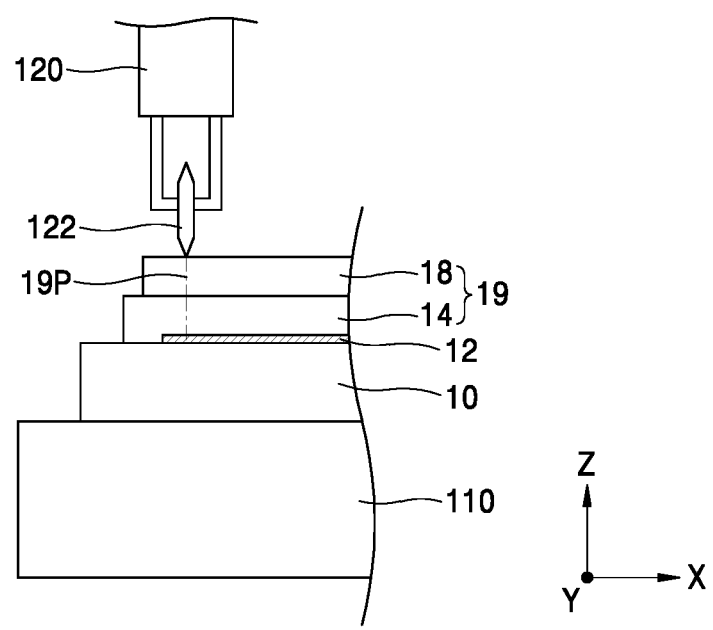
FIG. 6 is an enlarged cross-sectional view of an embodiment of a cutting unit of the cutting apparatus in FIG. 5.
Figure 7:
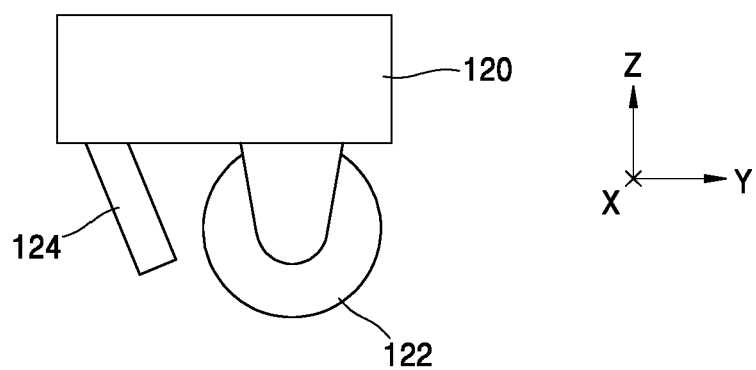
FIG. 7 is an enlarged cross-sectional view of another embodiment of a cutting unit of the cutting apparatus in FIG. 5.
Figure 8:
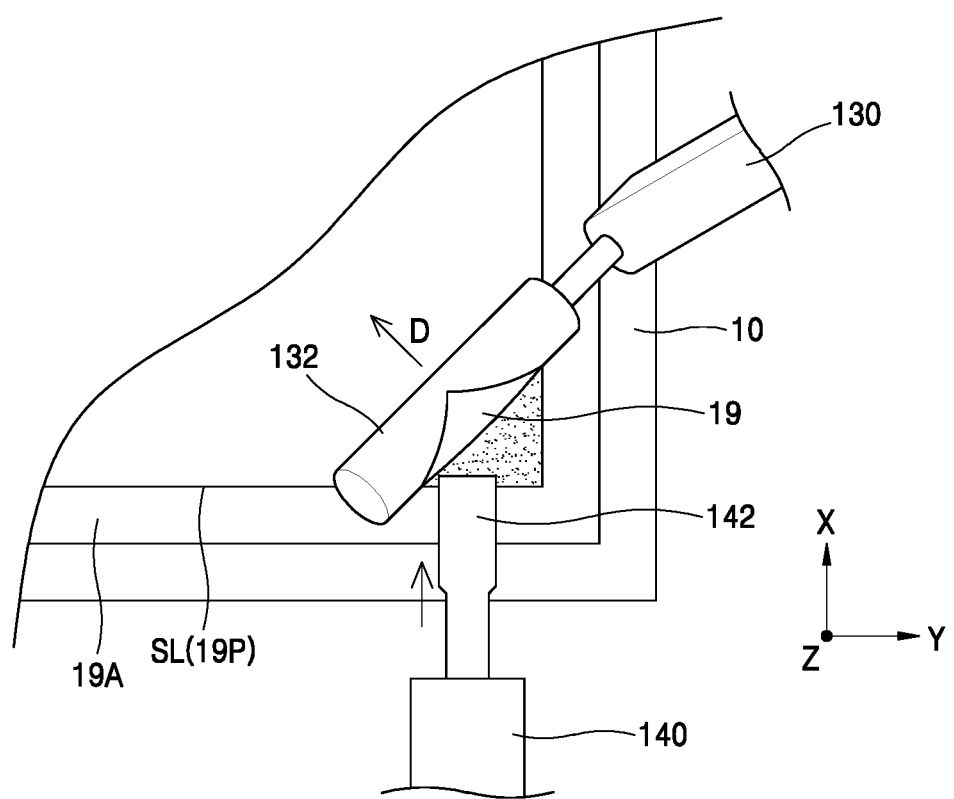
FIG. 8 is an enlarged partial top plan view illustrating an embodiment of an operation of a first detaching portion and a second detaching portion of the cutting apparatus in FIG. 5.

FIG. 5 is a schematic top plan view of an embodiment of a cutting apparatus 100 used in manufacturing a display device, according to the invention. FIG. 6 is an enlarged cross-sectional view of an embodiment of a cutting unit of the cutting apparatus 100 in FIG. 5. FIG. 7 is an enlarged cross-sectional view of another embodiment of a cutting unit of the cutting apparatus 100 in FIG. 5. FIG. 8 is an enlarged partial top plan view illustrating an embodiment of an operation of a first detaching unit 130 and a second detaching unit 140 of the cutting apparatus 100 in FIG. 5.

Referring to FIG. 5, the cutting apparatus 100 according to an embodiment may include a main frame 101, a cutting unit 120, the first detaching unit 130, the second detaching unit 140, a first guide rail 150, and a second guide rail 160.

Configuration elements of the cutting apparatus 100 such as a stage 110, the cutting unit 120, the first detaching unit 130, the second detaching unit 140, the first guide rail 150, and the second guide rail 160 may be arranged above the main frame 101 along a cross-sectional thickness direction.

An object to be processed by undergoing processing such as cutting by the cutting apparatus 100, is placed on the stage 110. In an embodiment, for example, as shown in FIG. 6, the object to be processed as the release layer 12, the preliminary base substrate 14 and the preliminary first protective film 18 sequentially laminated above the carrier substrate 10, may be in a state in which cutting has not yet begun in a manufacturing process of the display device 1 in FIG. 1. Hereinafter, for convenience of explanation, the preliminary base substrate 14 and the preliminary first protective film 18 are referred to as a preliminary stacked body 19. However, the preliminary stacked body 19 is not limited to a laminated structure of the preliminary base substrate 14 and the preliminary first protective film 18. In an embodiment, the preliminary stacked body 19 may be understood to refer to the preliminary base substrate 14 alone. The preliminary stacked body 19 may also include the display unit 16.

The stage 110 has a rectilinear planar shape such as an overall rectangle disposed in a plane defined by a first direction Y and a second direction X which cross each other. The stage 110 is rotatable about an axis at a center C of the planar shape. The axis may be extended along a third direction Z which crosses each of the first direction Y and the second direction X. In addition, a vacuum hole 113 may be provided in plurality in the stage 110, with which positions of objects to be processed which are placed on the stage 110 may be fixed. As a result, the objects to be processed placed on the stage 110 may rotate together with the stage 110.

The first guide rail 150 lengthwise extending in a direction parallel to the first direction Y is positioned on the main frame 101. A first horizontal moving unit 172 is connected to the first guide rail 150 and is movable along a length of the first guide rail 150 to be movable in the direction parallel to the first direction Y. The first horizontal moving unit 172 has a shape extending in the second direction X. In an embodiment, the second direction X may be perpendicular to the first direction Y. A first end of a first connecting unit 182 is connected to the first horizontal moving unit 172. The first connecting unit 182 is movable along a length the first horizontal moving unit 172, so as to be movable in both the first direction Y and the second direction X. In addition, a second end of the first connecting unit 182 which is opposite to the first end thereof, is connected to the cutting unit 120.

The cutting unit 120 which is connected to the first guide rail 150 via the first connecting unit 182 (e.g., a cutter connector as a first connector) and the first horizontal moving unit 172 (e.g., a first horizontal connector) may move in the direction parallel to the first direction Y by a movement of the first horizontal moving unit 172 relative to the first guide rail 150, and move in the second direction X by a movement of the first connecting unit 182 relative to the first horizontal moving unit 172.

In addition, the first connecting unit 182 may adjust a height of the cutting unit 120 relative to the stage 110 and the object to be processed thereon, by adjusting a position of the cutting unit 120 in the third direction Z. As shown in FIG. 6, the cutting unit 120 moves in the second direction X to a cutting position of the object to be processed and thereafter the position of the cutting unit 120 is adjusted in a downward direction (e.g., toward the stage 110 along the third direction Z) so as to cut the preliminary stacked body 19. In such state where the cutting unit 120 is disposed at an adjusted downward position, the cutting unit 120 may move in the first direction Y and cut the preliminary stacked body 19 of the object along the third (vertical) direction Z.

In FIGS. 1, 2 and 4 described above, a horizontal direction may represent the first direction Y and/or the second direction X, while a vertical direction represents the third direction Z. In FIG. 3, the horizontal and vertical directions may variously represent the first direction Y and the second direction X, while a direction into the page view represents the third direction Z.

As described above, the stage 110 is rotatable in place, about an axis disposed at the center C. Therefore, even if the object to be processed has a rectangular shape, all edges of the object to be processed may be positioned to overlap with the cutting unit 120 by the rotation of the stage 110. Thus, even if the cutting unit 120 repeats movement in the first direction Y at a same position, the object to be processed may be cut along all the edges by the rotation of the stage 110. The cutting order may be the same as that shown and described in FIG. 3.

The cutting unit 120 may include a scribing wheel 122 to cut the preliminary stacked body 19. The scribing wheel 122 may represent the scribing wheel W in FIG. 1 described above. In addition, as shown in FIG. 7, the cutting unit 120 may further include a suction unit 124. The suction unit 124 may suction away fragments of the preliminary stacked body 19 or the like generated when cutting the preliminary stacked body 19 by the scribing wheel 122 and remove the fragments from remaining portions of the preliminary stacked body 19. The suction unit 124 may be arranged in the rear of the scribing wheel 122 based on a moving direction of the cutting unit 120, such that the suction unit 124 follows the scribing wheel 122 when the cutting unit 120 is moved along the preliminary stacked body 19. While FIGS. 6 and 7 show the moving direction along the first direction Y for an edge of the preliminary stacked body 19 which is extended in the first direction Y, the configuration of the cutting unit 120 of FIGS. 6 and 7 may also be applied in a moving direction along the second direction X.

Referring to FIG. 8, an area 19A between the scribing line SL and the exposed portion of the carrier substrate 10 may include end portions of the preliminary stacked body 19. Referring to FIGS. 1, 2, 4, 6 and 9, for example, an end portion of the preliminary base substrate 14, an end portion of the preliminary first protection layer 18 and/or an end portion of the release layer 12 may be disposed in the area 19A. Such end portions may remain on the carrier substrate 10 after the cut portions of the preliminary stacked layer 19 are removed to form the display device (refer to FIG. 4, for example), or may be removed as the fragments described above.

Referring to FIGS. 5 and 8, the first detaching unit 130 may be movable in a direction forming an acute angle with the first direction Y. The first detaching unit 130 may include a roller 132 with which the first detaching 130 provides a force to the cut portion of the preliminary stacked body 19 to separate the cut portion of the preliminary stacked body 19 from the carrier substrate 10 and release layer 12 thereon. In an embodiment, the roller 132 may be an adhesive roller which contacts an upper surface of the cut portion of the preliminary stacked body 19 and is temporarily adhered thereto to apply the force to the cut portion of the preliminary stacked body 19. In an embodiment, for example, the first detaching unit 130 may be arranged at one of a corner of the stage 110 having a planar shape such as a rectangle including a plurality of corners, and may be movable along a diagonal or inclined line between diagonally opposed corners of the rectangle.

To this end, the second guide rail 160 connected to the first detaching unit 130 is arranged above the main frame 101. A length extending direction of the second guide rail 160 is arranged to form an acute angle with a length extending direction of the first guide rail 150. The first detaching unit 130 may be connected to the second guide rail 160 by a second connecting unit 186, and a height of the first detaching unit 130 relative to the stage 110 and the object to be processed thereon, may be adjusted by the second connecting unit 186.

Referring again to FIGS. 5 and 8, the second detaching unit 140 may be connected to the first guide rail 150 and be movable in the direction parallel to the first direction Y. Particularly, a second horizontal moving unit 174 may be connected to the first guide rail 150. The second horizontal moving unit 174 may be movable along a length of the first guide rail 150. The second detaching unit 140 may be connected to the second horizontal moving unit 174 (e.g., a second horizontal connector) by a third connecting unit 184. The third connecting unit 184 may be movable along a length of the second horizontal moving unit 174. The second horizontal moving unit 174 may lengthwise extend in a same direction as a length of the first horizontal moving unit 172. Therefore, the second detaching unit 140 may be movable in the direction parallel to the first direction Y by a movement of the second horizontal moving unit 174, and may be movable in the second direction X by a movement of the third connecting unit 184.

After the cutting process of the cutting unit 120 is performed, the first detaching unit 130 and the second detaching unit 140 continuously perform the initial detaching of an edge region of the cut portion of the preliminary stacked body 19 from the carrier substrate 10 and/or the release layer 12.

In particular, as shown in FIG. 8, at a same time the first detaching unit 130 arranged at a corner of the stage 110 moves along a virtual line which is inclined along a direction D relative to sides or edges of the preliminary stacked body 19 and/or the stage 110, the roller attached to the cut portion of the preliminary stacked body 19 provides a force thereto to pull the cut portion of the preliminary stacked body 19 away from the carrier substrate 10 and/or the release layer 12, such as by rotation of the roller 132. Therefore, separation of the cut portion of the preliminary stacked body 19 from the carrier substrate 10 and/or the release layer 12 at the corner of the cut portion of the preliminary stacked body 19 may be referred to as a first initial detaching.

During and/or after the first initial detaching, the second detaching unit 140 is positioned such that a separating tool 142 such as a knife is arranged between the carrier substrate 10 and/or the release layer 12, and the first initial detached cut portion of the preliminary stacked body 19 at the corner of the cut portion of the preliminary stacked body 19. Since the separating tool 142 may be protruded in the second direction X, the separating tool 142 may be easily inserted between the cut portion of the preliminary stacked body 19, and the carrier substrate 10 and/or the release layer 12, which are detached and separated from each other at the corner of the cut portion of the preliminary stacked body 19 by a movement of the second detaching unit 140 in the second direction X.

When the separating tool 142 is arranged between the cut portion of the preliminary stacked body 19, and the carrier substrate 10 and/or the release layer 12, the second detaching unit 140 moves in the direction parallel to the first direction Y such that the separating tool 142 moves along an edge or side of the cut portion of the preliminary stacked body 19. The aforementioned process may be referred to as a second initial detaching. By doing so, the edge region of the cut portion of the preliminary stacked body 19 which extends along the first direction Y may be detached from the carrier substrate 10.

As described above, since the stage 110 is rotatable in place, the initial detaching may be performed for all of the edge regions of the object by repeating operations of the first detaching unit 130 and the second detaching unit 140. Such initial detaching may be performed at all corners of the object, without being limited thereto.

Thus, before the cut portion of the preliminary stacked body 19 and the carrier substrate 10 are completely separated from each other, when the initial detaching is firstly carried out, the cut portion of the preliminary stacked body 19 and the carrier substrate 10 may be more easily completely separated from each other and damage to the cut portion of the preliminary stacked body 19 during the overall detaching process may be reduced or effectively prevented.

Figure 9:
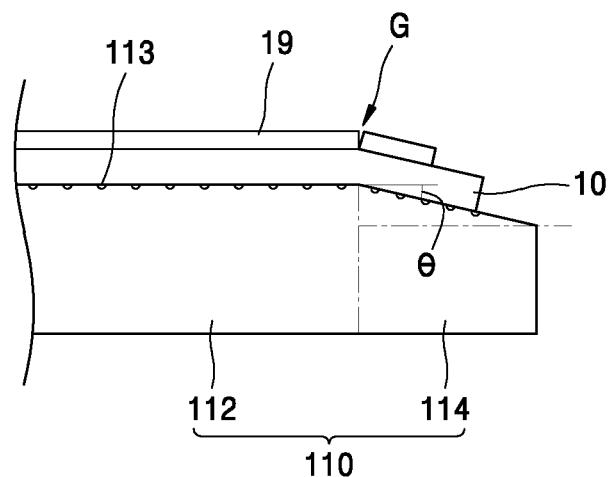
FIG. 9 is an enlarged cross-sectional view taken along line I-I' in FIG. 5.

FIG. 9 is an enlarged cross-sectional view taken along line I-I' in FIG. 5.

Although FIG. 9 shows a cross-section of one edge of the stage 110, the stage 110 having a planar shape of a rectangle may have a same cross-sectional shape at all four edges. Referring to FIG. 9, the stage 110 may include a central portion 112 having a flat upper surface, and an inclined portion 114 having an inclined upper surface which is outside the central portion 112. With reference to a lower surface of the state 110, a height of the inclined upper surface at the inclined portion 114 may be lower than a height of the flat upper surface of the central portion 112.

In an embodiment, the plurality of vacuum holes 113 are disposed along the upper surface of the stage 110 to fix a position of the object to be processed which is arranged along the upper surface of the stage 110.

Among the plurality of vacuum holes 113, a suction force generated by the vacuum holes 113 arranged at the inclined portion 114 may be greater than a suction force generated by the vacuum holes 113 arranged at the central portion 112. By doing so, the carrier substrate 10 and the preliminary stacked body 19 which is on the carrier substrate 10 may be brought into and maintained in close contact with both the flat surface of the central portion 112 and the inclined surface of the inclined portion 114 by the suction force of the plurality of vacuum holes 113. An angle θ of the inclined upper surface at the inclined portion 114 may be appropriately selected within a range in which the carrier substrate 10 is not damaged by stress from extension of the carrier substrate 10 over the boundary between the central portion 112 and the inclined portion 114.

When the stage 110 includes the inclined portion 114 at the edge of the stage 110, a cutting position of the preliminary stacked body 19 may correspond to a point where the inclined portion 114 starts relative to the central portion 112. When the preliminary stacked body 19 is vertically cut along the third direction Z at the point where the inclined portion 114 starts relative to the central portion 112, a space G is generated corresponding to such point. When the space G is formed as described above, the initial detaching of the cut portion of the preliminary stacked body 19 from the carrier substrate 10 may be performed more easily.

Figure 10:
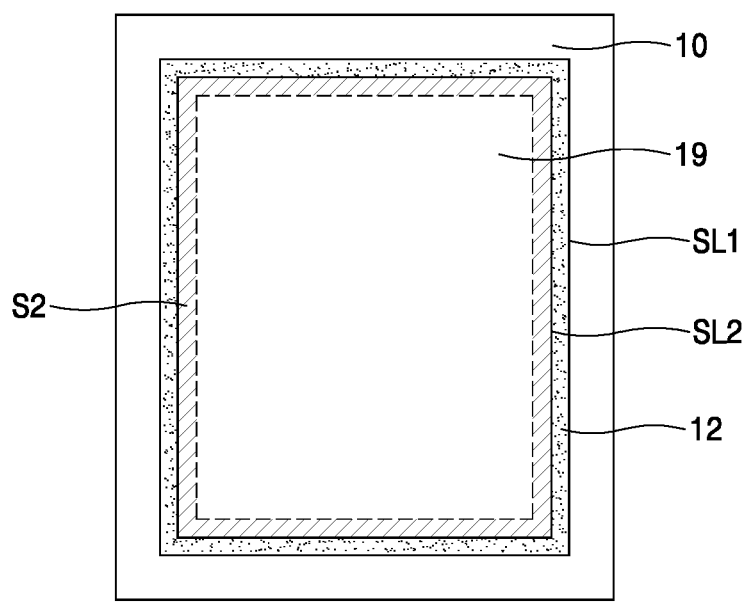
FIG. 10 is a top plan view illustrating an embodiment of a process in a method of manufacturing a display device by using the cutting apparatus in FIG. 5.

FIG. 10 is a top plan view illustrating an embodiment of a process in a method of manufacturing a display device by using the cutting apparatus 100 in FIG. 5. FIG. 10 shows a same state within the method of manufacturing a display device as that of FIG. 3, and only differences from the above will be described below.

FIG. 10 shows a result of the preliminary stacked body 19 which is cut twice at two different scribing lines. A first cutting position and a second cutting position are spaced apart from each other. A portion of the preliminary stacked body 19 positioned between a first scribing line SL1 along which a first cutting is performed and a second scribing line SL2 along which a second cutting is performed, is detached and removed from the carrier substrate 10 and/or the release layer 12 such that the release layer 12 may be exposed from the cut portion of the preliminary stacked body 19. The scribing line SL2 may correspond to one or more of an end or edge of the cut portion of the preliminary base substrate 14, the cut portion of the preliminary first protective film 18, etc. which forms the display device 1.

The first cutting and the second cutting are different from each other only in the cutting positions in the preliminary stacked body 19, and a method of performing the two cuttings is the same. In an embodiment, when the second cutting is performed after the first cutting, a portion of the preliminary stacked body 19 between the first scribing line SL1 and the second scribing line SL2 may have a line shape with a relatively narrow width or a ribbon shape. Where the cutting unit 120 including the suction unit 124 in FIG. 7 is used for performing the first cutting and the second cutting, a portion of the preliminary stacked body 19 between the first and second scribe lines SL1 and SL2 which is cut to the ribbon shape may be detached and removed from the carrier substrate 10 and/or the release layer 12 by the suction unit 124 in FIG. 7, when performing the second cutting.

That is, since the cut portion of the preliminary stacked body 19 at a central region of the carrier substrate 10 is spaced apart from an end portion of the preliminary stacked body 19 remaining on an outer periphery of the carrier substrate 10, the initial detaching of an edge region S2 of the cut portion of the preliminary stacked body 19 from the carrier substrate 10 may be performed more easily.

According to one or more of the embodiments of the present disclosure, since the edge region of the base substrate is firstly detached from the carrier substrate before separating a remaining portion of the base substrate from the carrier substrate, the carrier substrate and the remaining portion of the base substrate may be smoothly separated from each other without using expensive equipment such as a laser. Therefore, a risk of damaging elements of the display device including the portion of the base substrate during the separation process of the carrier substrate and the base substrate is reduced, and a manufacturing yield of the display device may be improved. The scope of the present disclosure is not limited to these effects.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A cutting apparatus comprising:
   a stage configured to receive a carrier substrate and a stacked body which is on the carrier substrate, the stage including a corner and an edge which extends from the corner along a first direction;
   a first detaching tool which is adjacent to the stage and includes an adhesive roller;
   a second detaching tool which is adjacent to the stage and includes a knife protruding in a second direction intersecting the first direction;
   a first guide rail which is positioned adjacent to the stage and lengthwise extending along the first direction;
   a first horizontal connector which is movably connected to the first guide rail along the first direction;
   a second guide rail which is positioned adjacent to the stage, the first detaching tool being movably connected to the second guide rail along the second guide rail;
   a lengthwise extending direction of the first guide rail and a lengthwise extending direction of the second guide rail forming an acute angle with each other,
   a cutter which is adjacent to the stage and cuts the stacked body both vertically and along the first direction into a cut stacked body, the cutter being movably connected to the first horizontal connector along the second direction; and
   the first detaching tool configured to perform a first initial detaching of the cut stacked body with respect to the carrier substrate from the corner when the second detaching tool performs a second initial detaching of the cut stacked body with respect to the carrier substrate from the edge,
   wherein
   the first initial detaching includes the adhesive roller of the first detaching tool moved in the lengthwise extending direction of the second guide rail at a same time the adhesive roller contacts with an upper surface of the cut stacked body which is at the corner, and
   the second initial detaching includes the knife of the second detaching tool moved in the first direction at a same time the knife is inserted between the carrier substrate and the cut stacked body.

2. The cutting apparatus of claim 1, wherein the stage has a planar shape and is rotatable with respect to a center of the planar shape.

3. The cutting apparatus of claim 1, wherein the first detaching tool is arranged adjacent to the corner of the stage.

4. The cutting apparatus of claim 3, wherein the first initial detaching further includes the adhesive roller moved along a virtual line inclined with respect to both the first and second directions, from the corner of the stage, together with being contactable with the cut stacked body.

5. The cutting apparatus of claim 1, wherein the second initial detaching further includes the knife moved in the first direction along the edge of the stage, from the corner of the stage, together with being insertable between the carrier substrate and the cut stacked body.

6. The cutting apparatus of claim 1, wherein the cutter comprises a scribing wheel.

7. The cutting apparatus of claim 1, further comprising a cutter connector which connects the first horizontal connector and the cutter to each other and which adjusts a height of the cutter relative to the stacked body in cutting of the stacked body.

8. The cutting apparatus of claim 1, further comprising a second horizontal connector movably connected to the first guide rail along the first direction,
wherein the second detaching tool protrudes in the second direction and is movably connected to the second horizontal connector along the first direction.

9. A cutting apparatus comprising:
a stage configured to receive a carrier substrate and a stacked body which is on the carrier substrate, the stage including a corner and an edge which extends from the corner along a first direction;
a cutter which is adjacent to the stage and cuts the stacked body both vertically and along the first direction into a cut stacked body;
the stage including:
  a central portion configured to receive the stacked body and having a flat surface,
  an inclined portion extended from the central portion and configured to receive a cut portion of the stacked body which is adjacent to the cut stacked body, and
  a plurality of vacuum holes defined in the stage, the plurality of vacuum holes configured to maintain the carrier substrate and the stacked body on the stage;
a first detaching tool which is adjacent to the stage, is movable in a direction forming an acute angle with the first direction, and includes an adhesive roller, the first detaching tool configured to perform a first initial detaching of the cut stacked body with respect to the carrier substrate from the corner; and
a second detaching tool which is adjacent to the stage, is movable along the first direction, and includes a knife protruding in a second direction intersecting the first direction, the second detaching tool configured to perform a second initial detaching of the cut stacked body with respect to the carrier substrate from the edge,
wherein
among the plurality of vacuum holes of the stage, a suction force generated by vacuum holes at the inclined portion is greater than a suction force generated by vacuum holes at the central portion and
the first initial detaching includes the adhesive roller of the first detaching tool moved in the acute angle with the first direction together with being contactable with an upper surface of the cut stacked body which is at the corner, together with the second initial detaching including the knife of the second detaching tool moved in the first direction together with being insertable between the carrier substrate and the cut stacked body.

* * * * *